(12) United States Patent
Xiong et al.

(10) Patent No.: US 11,418,023 B2
(45) Date of Patent: Aug. 16, 2022

(54) CURRENT PROTECTION CIRCUIT AND METHOD FOR HIGH VOLTAGE SYSTEM

(71) Applicant: UBTECH ROBOTICS CORP LTD, Shenzhen (CN)

(72) Inventors: Youjun Xiong, Shenzhen (CN); Sheng Zhou, Shenzhen (CN); Malin Wang, Shenzhen (CN); Wenhua Fan, Shenzhen (CN); Jianxin Pang, Shenzhen (CN)

(73) Assignee: UBTECH ROBOTICS CORP LTD, Shenzhen (CN)

( * ) Notice: Subject to any disclaimer, the term of this patent is extended or adjusted under 35 U.S.C. 154(b) by 518 days.

(21) Appl. No.: 16/535,112

(22) Filed: Aug. 8, 2019

(65) Prior Publication Data

US 2020/0195004 A1 Jun. 18, 2020

(30) Foreign Application Priority Data

Dec. 18, 2018 (CN) .......................... 201811554442.5

(51) Int. Cl.
*H02H 9/02* (2006.01)
*G01R 33/07* (2006.01)
*G01R 33/00* (2006.01)

(52) U.S. Cl.
CPC ........... *H02H 9/02* (2013.01); *G01R 33/0094* (2013.01); *G01R 33/07* (2013.01)

(58) Field of Classification Search
CPC .......... H02H 3/025; H02H 3/08; H02H 3/087; H02H 9/02; G01R 33/0094
See application file for complete search history.

(56) References Cited

U.S. PATENT DOCUMENTS

| | | | |
|---|---|---|---|
| 2017/0033554 A1* | 2/2017 | Vail ......................... | H02H 5/005 |
| 2017/0093145 A1* | 3/2017 | Nate ....................... | H02H 3/093 |
| 2018/0294635 A1* | 10/2018 | Kozuki ................. | H02H 3/085 |

FOREIGN PATENT DOCUMENTS

| | | |
|---|---|---|
| CN | 103597688 A | 2/2014 |
| CN | 104617653 A | 5/2015 |
| CN | 106602501 A | 4/2017 |

\* cited by examiner

*Primary Examiner* — Jared Fureman
*Assistant Examiner* — Christopher J Clark

(57) ABSTRACT

A current protection circuit for a high voltage system includes: a power supply module to supply power to a load through a high voltage bus and a low voltage bus; a detection module connected to the high voltage bus and used to detect a value of current flowing through the high voltage bus; a signal processing module electrically connected to the detection module and used to amplify the current flowing through the high voltage bus; and a control module electrically connected to the signal processing module, the power supply module, and the load, and used to disconnect the load from the power supply module or perform current limiting for the load when the value of the amplified current exceeds a preset threshold.

18 Claims, 2 Drawing Sheets

CURRENT PROTECTION CIRCUIT AND METHOD FOR HIGH VOLTAGE SYSTEM

CROSS REFERENCE TO RELATED APPLICATIONS

This application claims priority to Chinese Patent Application No. 201811554442.5, filed Dec. 18, 2018, which is hereby incorporated by reference herein as if set forth in its entirety.

BACKGROUND

1. Technical Field

The present disclosure generally relates to over-current protection circuits, and particularly to a current protection circuit and method for a high voltage system.

2. Description of Related Art

Many high-voltage systems, such as high-power servo systems, frequency converters, air conditioners, CNC machines, include a power supply system, a current detection system, a control system, and a load system. In order to improve the reliability of the high voltage systems, it is necessary to monitor the current flowing through the buses of the high voltage systems in real time, so as to realize the overcurrent protection. That is, when the value of the current is greater than or equal to a threshold, control is performed to improve the reliability of the overall system.

One conventional current protection solution monitors the current flowing through the bus on the low voltage side of the high voltage system to realize the current protection of the bus. One problem with the current protection solution is that the current does not flow through the detection component on the low voltage side when the load failure occurs. As a result, the high voltage system cannot be protected, which may result in component damage or unsafe system failure.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
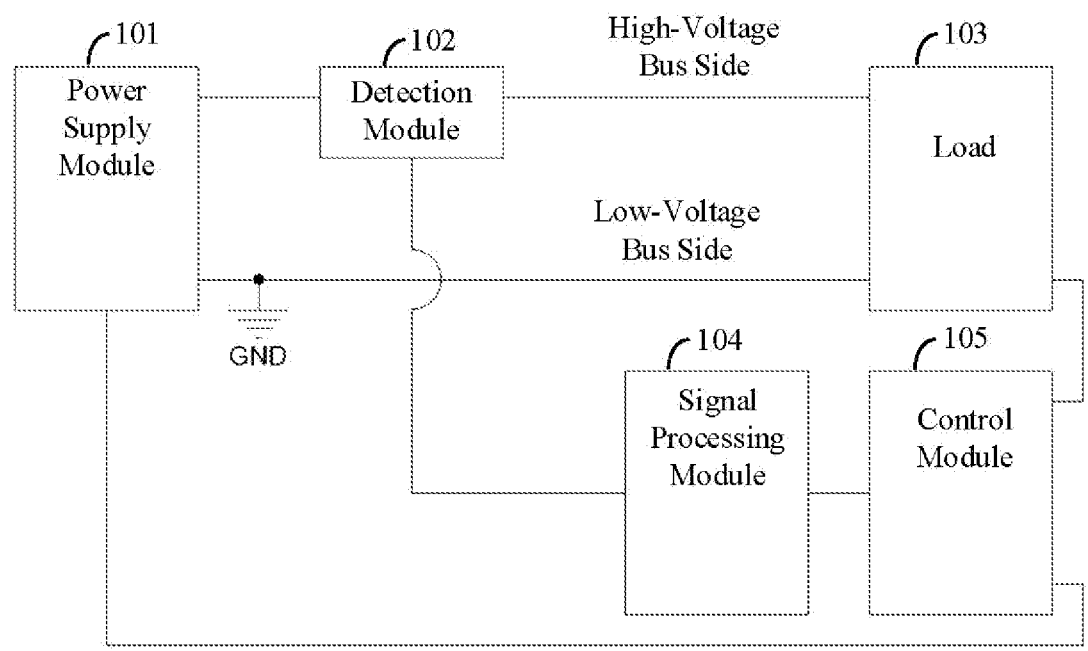
FIG. 1 is a schematic block diagram of a current protection circuit for a high voltage system according to an embodiment.

The disclosure is illustrated by way of example and not by way of limitation in the figures of the accompanying drawings, in which like reference numerals indicate similar elements. It should be noted that references to "an" or "one" embodiment in this disclosure are not necessarily to the same embodiment, and such references can mean "at least one" embodiment.

A generalized description of the current protection circuit and method for a high voltage system is provided. The current flowing through the bus on the high voltage side of the high voltage system is monitored in real-time. When the value of the amplified current is greater than a preset threshold, the control module receives a determined digital level signal, which can be used to control the high voltage system, thereby controlling the power supply module or the load to achieve current protection for the bus. Moreover, it is beneficial to cost control for the current protection for bus on the high-voltage side of the high voltage system to be achieved based on NPN type bipolar junction transistor or PNP type bipolar junction transistor. When the current value is less than the preset threshold (within a certain accuracy range), the output digital level signal is a normal level. When the current value of the load is greater than a preset threshold (within a certain accuracy range), a digital level signal reverse to the normal level is output. The digital level signal is fed back to the control module for control (e.g. current limiting, cycle-by-cycle current increasing, cycle-by-cycle current reduction), which is beneficial for the voltage value of the power supply system to remain relatively stable. Components will not be damaged due to excessive current flowing through the load. When the load is short-circuited, a digital level signal reverse to the normal level is output. The digital level signal is fed back to the control module for control (e.g. cutoff of power, current limiting, cycle-by-cycle current limiting control), which is beneficial for the voltage value of the power supply system to remain relatively stable. Components will not be damaged due to excessive current flowing through the load. The current protection for bus on the high-voltage side of the high voltage system, based on NPN type bipolar junction transistor or PNP type bipolar junction transistor, is a cost-effective way to achieve current protection on high-voltage side of high-voltage systems, thereby improving the cost-effectiveness and reliability of the overall system.

Referring to FIG. 1, in one embodiment, a current protection circuit for a high voltage system includes a power supply module 101, a detection module 102, a signal processing module 104, and a control module 105.

The power supply module 101 supplies electrical power to a load 103 through a high voltage bus and a low voltage bus.

The detection module 102 is electrically connected to the high voltage bus and detects a value of current flowing through the high voltage bus.

The signal processing module 104 is electrically connected to the detection module 102 and amplifies the current flowing through the high voltage bus.

The control module 105 is electrically connected to the signal processing module 104, the power supply module 101, and the load 103, and disconnects the load 103 from the power supply module 101 or performs current limiting for the load 103 when the value of the amplified current exceeds a preset threshold.

In one embodiment, the detection module 102 includes a resistor. When a current flows through the resistor, a signal is generated, which is typically small and needs to be amplified by the associated circuit of signal processing module 104. The amplified current is output to the control module 105, and the control module 105 controls the load 103 according to the detected current value, such as cutoff of power, current limiting, cycle-by-cycle current limiting, to protect the entire high voltage system. In the embodiment, the detection module 102 includes a shunt resistor, which works by measuring the voltage drop across a known resistance. Ohm's law states that V=I×R, or solving for I, I=V/R, where I is current, V is voltage, and R is resistance. If the resistance is known and the voltage drop is measured, then the current can be determined.

In one embodiment, the detection module 102 may be an isolated component that includes a hall sensor or a transformer. When a current flows through the isolated component, a signal is generated, which is typically small and needs to be amplified by the associated circuit of signal processing module 104. The amplified current is output to the control module 105, and the control module 105 controls the load 103 according to the detected current value, such as cutoff of power, current limiting, cycle-by-cycle current limiting, to protect the entire high voltage system.

In one embodiment, the high voltage system can be applied to high power servo systems, high power servo-mechanisms, frequency converters, central air conditioners, CNC machines, and the like. The current protection on the high voltage side of the high voltage system can provide more protection to the entire system than the current protection on the low voltage side, which facilitates the stability of the system. When the value of the current flowing through the bus on the high-voltage side is less than the first preset threshold, the output digital level signal is at a normal level and the control module 105 does not perform current limiting, which allows the high-voltage system to operate normally. If an inverter or a non-inverting buffer are used for current detection, a digital level signal reverse to the normal level is output when the value of the current flowing through the bus is greater than the preset threshold. If an MCU, PLC or motion controller with analog input function is used for current detection, a current limiting signal or a digital level signal reverse to the normal level is output when the value of the current flowing through the bus is greater than the first preset threshold and less than a second preset threshold. The digital level signal is fed back to the control module 105 for control (e.g. current limiting, cycle-by-cycle current increasing, cycle-by-cycle current reduction) of the power supply module 101 or the load 103, which is beneficial for the voltage value of the power supply module 101 to remain relatively stable. Components will not be damaged due to excessive current flowing through the load 103. When the load is short-circuited, a digital level signal reverse to the normal level is output. The digital level signal is fed back to the control module 105 for control (e.g. current limiting, cycle-by-cycle current increasing, cycle-by-cycle current reduction) of the power supply module 101 or the load 103, which is beneficial for the voltage value of the power supply module 101 to remain relatively stable. Components will not be damaged due to excessive current flowing through the load 103, thereby improving the stability of the entire system.

Figure 2:
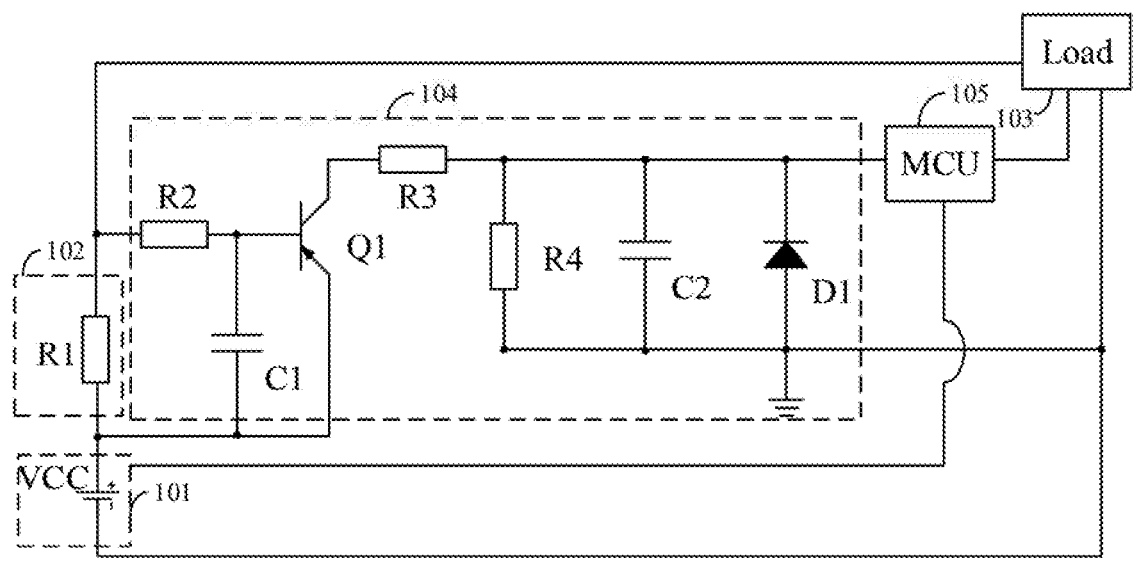
FIG. 2 is a schematic circuit diagram of the current protection circuit of FIG. 1.

Referring to FIG. 2, in one embodiment, the power supply module 101 includes an alternating current (AC) power source VCC having a preset voltage value.

In one embodiment, the detection module 102 includes a first resistor R1. A first terminal of the first resistor R1 is connected to the AC power source VCC, and a second terminal of the first resistor R1 is connected to the load 103.

In one embodiment, the signal processing module 104 includes a second resistor R2, a third resistor R3, a fourth resistor R4, a diode D1, a first capacitor C1, a second capacitor C2, and a switching transistor Q1.

A first terminal of the second resistor R2 is connected to the detection module 102, and a second terminal of the second resistor R2 is connected to a first terminal of the first capacitor C1 and a controlled terminal of the switching transistor Q1. A second terminal of the first capacitor C1 is connected to an input terminal of the switching transistor Q1. An output terminal of the switching transistor Q1 is connected to a first terminal of the third resistor R3. A second terminal of the third resistor R3, a first terminal of the fourth resistor R4, a first terminal of the second capacitor C2, and a cathode of the diode D1 are connected in common and connected to the control module 105. A second terminal of the fourth resistor R4, a second terminal of the second capacitor C2, and an anode of the diode D1 are grounded.

In one embodiment, the switching transistor Q1 is an NPN type bipolar junction transistor or a PNP type bipolar junction transistor.

The collector, the emitter and the base of the NPN type bipolar junction transistor are respectively the input terminal, the output terminal and a controlled terminal of the switching transistor Q1.

The emitter, the collector and the base of the PNP type bipolar junction transistor are respectively the input terminal, the output terminal and a controlled terminal of the switching transistor Q1.

Based on the NPN type bipolar junction transistor or PNP type bipolar junction transistor, the current detection and protection function on the high voltage side of the high voltage system is realized with relative low cost. The cost performance and reliability of the system can be greatly improved, which facilitates the industrialization of the system.

In one embodiment, the control module 105 may be implemented by single chip microcomputer MCU. The control module 105 can also be implemented by a non-inverting buffer or an inverter. The control module 105 can also be implemented by other components, such as driving chip, a single chip microcomputer, a programmable logic controller or a motion controller, with a control terminal, on the condition that the control module 105 outputs a signal reverse to the normal level in response to the amplified signal when the current threshold is exceeded.

In one embodiment, a current protection method for the aforementioned high voltage system includes the following steps:

Step S101: supply power, by the power supply module 101, through a high voltage bus and a low voltage bus to the load 103.

Step S102: detect, by the detection module 102 that is electrically connected to the high voltage bus, a value of current flowing through the high voltage bus.

Step S103: amplify, by the signal processing module 104, the current flowing through the high voltage bus.

Step S104: disconnect the load 103 from the power supply module 101 or perform current limiting for the load 103, by the control module 105, when the value of the amplified current exceeds a first preset threshold.

In one embodiment, the step S104 further includes: disconnect the load 103 from the power supply module 101, by the control module 105, when the value of the amplified current exceeds a second preset threshold that is greater than the first preset threshold; and perform current limiting for the load 103, by the control module 105, when the value of the amplified current is in a range between the first preset threshold and the second preset threshold.

The working principle of the current protection circuit for a high voltage system will be described below with reference to FIG. 1 and FIG. 2 as follows:

The value R of the first resistor R1 can be changed according to the actual current protection threshold. The AC power source VCC is connected to the first resistor R1 to supply electrical power to the load 103. The switching transistor Q1 is a PNP type bipolar junction transistor, and can be changed by reselecting a PNP type bipolar junction transistor with different parameters according to the high voltage value of the high voltage system. The amplification factor of the switching transistor Q1 is represented by Hfe. In the embodiment, the PNP transistor has a collector-emitter voltage of 200V, and the Hfe equals to 100. The single chip microcomputer MCU mainly functions to output the determined level signal, and the output level can be change according to actual application.

When the value of the current flowing through the first resistor R1 is less than or equal to the preset current threshold, the single chip microcomputer MCU outputs low level. When the value of the current flowing through the first resistor R1 is greater than or equal to the preset current threshold, the single chip microcomputer MCU outputs high level. When the control module 105 is implemented by different devices, the input voltage threshold for changing the output level is different. The input voltage threshold is represented by Uin. When the input voltage of the single chip microcomputer MCU is less than or equal to Uin, the output level is a normal level. When the input voltage of the single chip microcomputer MCU is greater than Uin, the output of U 1 is at a level reverse to the normal level. For example, when the input voltage of the single chip microcomputer MCU is less than or equal to 2V, the single chip microcomputer MCU outputs low level. When the input voltage of the single chip microcomputer MCU is greater than 2V, the single chip microcomputer MCU outputs high level. The Ic of the switching transistor Q1 equals to Uin/R4. In the embodiment, Ic=2V/1K=2 mA. According to the data sheet of the switching transistor Q1, the current flowing through the base of the switching transistor Q1 can be determined according to the formula Ib=Ic/Hfe. In the embodiment, Ib=2 mA/100=0.02 mA. It can be determined that the emitter-base voltage of the switching transistor Q1 is calculated according to the formula U(R1)=Ib*R2+Ueb. The protection current threshold can be determined according to the formula I(protection)=U(R1)/R1. A more convenient method is that the data sheet of the switching transistor Q1 shows that Ic equals to 2 mA when Ueb equals to 0.6V. Accordingly, the protection voltage can be determined according to the formula U(R1)=0.02 mA*1K+0.6V=0.62V. The protection current value can be determined according to the formula I(protection)=0.62V/0.015Ω=41.33 A. A simulation result is in consistent with the above theoretical value. Thus, protection current threshold equals to 41.33 A. When the current flowing through the first resistor R1 is less than 41.33 A, the single chip microcomputer MCU outputs low level to the control system, and the high voltage system works normally. When the current flowing through the first resistor R1 is greater than or equal to 41.33 A, the single chip microcomputer MCU outputs high level to the control module 104. The control module 104 then controls the power supply module 101 or the load 103, such as cutting off power, limiting current, or controlling current cycle by cycle, thereby protecting the entire system, which can greatly improve the reliability of the entire system.

In terms of reliability, compared with conventional current protection for bus on the low-voltage side of the high-voltage system, the protection scope of the system of the present disclosure is wider, which is more conducive to the reliability of the overall system. In terms of cost, the current protection for the bus on the high voltage side of the high voltage system based on the PNP type bipolar junction transistor or the NPN bipolar junction transistor has a cost advantage over the conventional current protection solution. The solution of the present disclosure facilitates the wide-range application of high voltage systems, greatly improving the cost performance and reliability of the overall system.

A current protection circuit and a current protection method for a high voltage system are provided by the aforementioned embodiments of the present disclosure. Specifically, electrical power is supplied to the load through the high voltage bus and the low voltage bus, the current flowing through the high voltage bus is detected and then amplified, and power is cut off or current flowing through the load is limited when the value of the amplified current exceeds a preset threshold. Therefore, the current protection for high voltage bus of the high-voltage system is achieved, and components are prevented from being damaged due to excessive current flowing through the load, thereby improving the stability of the high-voltage system. The current protection circuit and a current protection method for a high voltage system has addressed the problem of component damage or unsafe system failure of the conventional current protection for bus on the low-voltage side of the high-voltage system.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A current protection circuit for a high voltage system, comprising:
   a power supply module configured to supply power to a load through a high voltage bus and a low voltage bus;
   a detection module connected to the high voltage bus and configured to detect a value of current flowing through the high voltage bus;
   a signal processing module electrically connected to the detection module and configured to amplify the current flowing through the high voltage bus; and
   a control module electrically connected to the signal processing module, the power supply module, and the load, and configured to disconnect the load from the power supply module or perform current limiting for the load when the value of the amplified current exceeds a preset threshold;
   wherein the signal processing module comprises a second resistor, a third resistor, a fourth resistor, a diode, a first capacitor, a second capacitor, and a switching transistor;
   a first terminal of the second resistor is connected to the detection module, and a second terminal of the second resistor is connected to a first terminal of the first capacitor and a controlled terminal of the switching transistor;
   a second terminal of the first capacitor is connected to an input terminal of the switching transistor, an output terminal of the switching transistor is connected to a first terminal of the third resistor; a second terminal of the third resistor, a first terminal of the fourth resistor, a first terminal of the second capacitor, and a cathode of the diode are connected in common and connected to the control module, and a second terminal of the fourth resistor, a second terminal of the second capacitor, and an anode of the diode are grounded.

2. The current protection circuit according to claim 1, wherein the detection module comprises a resistor.

3. The current protection circuit according to claim 1, wherein the detection module is an isolated component that comprises a ball sensor or a transformer.

4. The current protection circuit according to claim 1, wherein the power supply module comprises an AC/DC power supply having a nominal voltage range.

5. The current protection circuit according, to claim 4, wherein the detection module comprises a first resistor, a first terminal of the first resistor is connected to the AC/DC power supply, and a second terminal of the first resistor is connected to the load.

6. The current protection circuit according to claim 1, wherein the switching transistor is an NPN type bipolar junction transistor, a collector, an emitter and a base of which are respectively the input terminal, the output terminal and a controlled terminal, or a PNP type bipolar junction transistor, an emitter, a collector and a base of which are respectively the input terminal, the output terminal and a controlled terminal.

7. The current protection circuit according to claim 1, wherein the control module is a driving chip, a single chip microcomputer, a programmable logic controller or a motion controller, with a control terminal.

8. The current protection circuit according to claim 1, wherein a normal level is output when the value of the amplified current is less than the preset threshold, and a digital level signal reverse to the normal level is output when the value of the amplified current is greater than the preset threshold.

9. The current protection circuit according tee claim 1, wherein the control module is further configured to:
   disconnect the load from the power supply module, when the value of the amplified current exceeds a second preset threshold that is greater than the first preset threshold; and
   perform current limiting for the load, when the value of the amplified current is in a range between the first preset threshold and the second preset threshold.

10. A current protection method for a high voltage system, the high voltage system comprising a power supply module, a detection module, a signal processing module, and a control module, the current protection method comprising:
   supplying power, by the power supply module, through a high voltage bus and a low voltage bus to a load;
   detecting, by the detection module that is electrically connected to the high voltage bus, a value of current flowing through the high voltage bus;
   amplifying, by the signal processing module, the current flowing through the high voltage bus; and
   disconnecting the load from the power supply module or performing current limiting for the load, by the control module, when the value of the amplified current exceeds a first preset threshold;
   wherein the signal processing module comprises a second resistor, a third resistor, a fourth resistor, a diode, a first capacitor, a second capacitor, and a switching transistor;
      a first terminal of the second resistor is connected to the detection module, and a second terminal of the second resistor is connected to a first terminal of the first capacitor and a controlled terminal of the switching transistor;
      a second terminal of the first capacitor is connected to an input terminal of the switching transistor, an output terminal of the switching transistor is connected to a first terminal of the third resistor; a second terminal of the third resistor, a first terminal of the fourth resistor, a first terminal of the second capacitor, and a cathode of the diode are connected in common and connected to the control module, and a second terminal of the fourth resistor, a second terminal of the second capacitor, and an anode of the diode are grounded.

11. The current protection method according to claim 10, wherein the step of disconnecting the load from the power supply module or performing current limiting for the load, by the control module, when the value of the amplified current exceeds a first preset threshold, further comprising:
   disconnecting the load from the power supply module, by the control module, when the value of the amplified current exceeds a second preset threshold that is greater than the first preset threshold; and
   performing current limiting for the load, by the control module, when the value of the amplified current is in a range between the first preset threshold and the second preset threshold.

12. The current protection method according to claim 10, wherein the detection module comprises a resistor.

13. The current protection method according to claim 10, wherein the detection module is an isolated component that comprises a hall sensor or a transformer.

14. The current protection method according to claim 10, wherein the power supply module comprises an AC/DC power supply having a nominal voltage range.

15. The current protection method according to claim 14, wherein the detection module comprises a first resistor, a first terminal of the first resistor is connected to the AC/DC power supply, and a second terminal of the first resistor is connected to the load.

16. The current protection method according to claim 10, wherein the switching transistor is an NPN type bipolar junction transistor, a collector, an emitter and a base of which are respectively the input terminal, the output terminal and a controlled terminal, or a PNP type bipolar junction transistor, an emitter, a collector and a base of which are respectively the input terminal, the output terminal and a controlled terminal.

17. The current protection method according to claim 10, wherein the control module is a driving chip, a single chip microcomputer, a programmable logic controller or a motion controller, with a control terminal.

18. The current protection method according to claim 10, wherein a normal level is output when the value of the amplified current is less than the preset threshold, and a digital level signal reverse to the normal level is output when the value of the amplified current is greater than the preset threshold.

* * * * *